(12) United States Patent
Chen et al.

(10) Patent No.: US 7,123,117 B2
(45) Date of Patent: Oct. 17, 2006

(54) LAN MAGNETIC INTERFACE CIRCUIT

(75) Inventors: John Chen, Danville, CA (US); Steve Contreras, Pleasanton, CA (US)

(73) Assignee: Bel-Fuse Inc., Jersey City, NJ (US)

( * ) Notice: Subject to any disclaimer, the term of this patent is extended or adjusted under 35 U.S.C. 154(b) by 188 days.

(21) Appl. No.: 10/851,618

(22) Filed: May 21, 2004

(65) Prior Publication Data
US 2004/0239465 A1    Dec. 2, 2004

Related U.S. Application Data

(60) Provisional application No. 60/472,448, filed on May 21, 2003.

(51) Int. Cl.
*H03H 7/00* (2006.01)

(52) U.S. Cl. .................. 333/177; 333/12; 333/185

(58) Field of Classification Search ............. 333/22 R, 333/177, 12, 185, 181
See application file for complete search history.

(56) References Cited

U.S. PATENT DOCUMENTS

| | | | | |
|---|---|---|---|---|
| 5,077,543 A | * | 12/1991 | Carlile | ................ 333/177 |
| 5,313,358 A | * | 5/1994 | Severinsky | ................ 361/118 |
| 5,659,273 A | * | 8/1997 | Harpham | ................ 333/22 R |
| 5,825,259 A | * | 10/1998 | Harpham | ................ 333/22 R |
| 6,946,924 B1 | * | 9/2005 | Chominski | ............. 331/177 V |

* cited by examiner

*Primary Examiner*—Anh Mai
(74) *Attorney, Agent, or Firm*—Ostrolenk, Faber, Gerb & Soffen, LLP

(57) ABSTRACT

A magnetic interface circuit for a LAN, such as an Ethernet network, includes a transformer having a first winding connected to the line side of the LAN and a second winding connected to the circuit side of the LAN. Each of the first and second windings has two output ports and one of the windings has a center tap port A 3-wire common mode choke having a center winding and two outer windings, the center winding of a 3-wire common mode choke is connected to the center tap of the one winding and the outer windings of the 3-wire common mode choke are respectively connected to the output ports of the one winding.

14 Claims, 4 Drawing Sheets

LAN MAGNETIC INTERFACE CIRCUIT

CROSS-REFERENCE TO RELATED APPLICATIONS

This application is based on and claims the benefit of U.S. Provisional Application No. 60/472,448, filed May 21, 2003, and entitled "IMPROVED LAN MAGNETIC INTERFACE CIRCUIT," the entire disclosure of which is incorporated by reference herein.

BACKGROUND OF THE INVENTION

The present invention relates generally to LAN (local area network) magnetic interface circuits and, more particularly, to LAN magnetic interface circuits having improved EMI (electromagnetic interference) performance.

One of the basic requirements for a LAN magnetic interface circuit is to provide electrical isolation. This is achieved by the use of an isolation transformer. The isolation transformer electromagnetically couples signals (data) from the primary-side (circuit side) to the secondary-side (line side). Hence, the primary and secondary windings of the transformer are electrically isolated from each other. The transformer is designed to meet the Hi-Pot (high potential) isolation requirements defined in the IEEE802.3 standard.

Another basic element of the LAN magnetic interface circuit is a common-mode choke (CMC). Simply stated, the CMC allows data signals (differential-mode) to pass through it unimpeded, but presents a high impedance to common-mode signals and noise. Such common-mode noise is the major cause of EMI (electromagnetic interference). The FCC and the IEEE 802.3 Standards have strict limits on the amount of EMI that an electronic system is allowed to conduct or radiate into the environment.

A third widely used element of the LAN magnetic interface circuit is an autotransformer, also known as a Bob Smith Termination (BST). The BST, in conjunction with a resistor-capacitor network, provides impedance matching between the unshielded twisted pairs (UTP) of the Ethernet cable and acts to shunt common-mode signals and noise to ground through a high voltage capacitor.

FIGS. 1 and 2 show examples of typical magnetic interface circuits commonly used in modern day Ethernet networking equipment, with FIG. 1 showing a standard magnetic interface circuit 10 utilizing an autotransformer (BST) 12 and FIG. 2 showing a standard magnetic interface circuit 14 commonly used for Auto-MDI/MDIX (Media Dependent Interface/Media Dependent Interface Crossover) Ethernet applications.

Each circuit includes two channels: a transmit channel 16 and a receive channel 18. In the case of FIG. 1, the transmit channel 16 includes the autotransformer 12 which is connectable to the Ethernet network (not shown) on the line side 20 via an RJ connector (not shown). The autotransformer 12 is connected to a CMC 22 which, in turn, is connected to one of the windings of an isolation transformer 24 whose other winding is connectable to the circuit side 26 of the channel.

The receive channel 18 includes an isolation transformer 28, one winding of which is connectable on the line side 16 to the Ethernet network (not shown) via an RJ connector (not shown) with the other winding connected to a CMC 30 which, in turn, is connectable to the circuit side 26 of the port. A termination network 32 is connected to each of the channels.

In FIG. 2, each of the channels 16 and 18 is identical and includes a CMC 34 connected between the line side 20 of the port and one of the windings of an isolation transformer 36, the other winding of which is connectable to the circuit side 26 of the port. A termination network 38 is connected to each of the channels.

These two-channel configurations are used primarily in 10/100 Base-T Ethernet equipment. The schematics shown are for a 10/100 single Ethernet port.

These magnetic circuit topologies are also used in 1000 BASE-T equipment (Gigabit Ethernet), which differs from 10/100 Base-T in that 4 channels per port are required, and all 4 channels should have identical magnetic interface circuits. Each of the 4 channels of a Gigabit port are used to both transmit and receive data, hence, the transmit and receive designations used in connection with the circuits of FIGS. 1 and 2 do not apply in this situation.

The term "noise" used herein refers to any undesired signal component that is present in the circuit, or on power and ground planes. Such noise has the potential to cause EMI. Sources of noise include: digital signals, clock signals and their harmonics; signal overshoots, spikes, ringing and distortion; rapidly rising and falling voltage transitions (dv/dt); rapid current changes (di/dt); switching power supply ripple voltage and switching spikes, etc.

The LAN magnetic interface circuit topologies depicted in FIGS. 1 and 2 have been used successfully in Ethernet networking equipment for many years. However, these circuit topologies were developed years ago when CPU, data buses, and clock speeds were relatively low and EMI was easier to control. Modern day networking equipment, on the other hand, is far more difficult to achieve EMI compliance for many reasons. Some of the major factors are:

1) Advances in technology are yielding extremely complex integrated circuits and system designs with very high circuit densities, very high clock and data bus speeds, and much lower supply voltages. Rise and fall times of digital signals are in the sub-nanosecond ranges. This, combined with the enormous number interconnecting traces and via's on the system PCB (printed circuit board), has the undesired consequence of increased noise and EMI generation. This is particularly true for systems with inferior PCB layouts, meaning that the PCB was not designed in accordance with established PCB design rules that must be instituted in order to minimize EMI caused by the PCB layout itself.

2) 100 Mb and Gigabit Ethernet transceiver ICs (integrated circuits) incorporate a 125 MHZ clock and have multiple Phase Locked Loops (PLL) running at 125 MHZ. Consequently, there will be a strong presence of 125 MHZ and harmonics (250, 375, 500, 625, 750, 875 and 1000 MHZ) within the circuit and on the power planes as well. As a result, 125 MHZ and, to a greater extent its harmonics, are among the worst offending frequencies in Ethernet networking systems with EMI problems, especially in multi-port systems where up to 192 channels (48 port gigabit) are being driven simultaneously.

3) The vast majority of Ethernet networking systems have migrated to using RJ45 Integrated Connector Modules (ICM). An ICM is a single or multi-port RJ45 connector that has the LAN magnetic interface circuit and common-mode termination components for each port placed inside (integrated into) the connector housing to form a functional unit. Therefore, the electrical isolation barrier between the RJ45 contacts and the systems circuitry is located inside the ICM. This is very significant because the circuit-side and line-side circuitry and components are no longer physically separated (by a moat) on the system PCB. Instead, circuit-side signal, power and ground layers of the PCB are brought right up-to, beneath, and around the ICM and the signal lines and power connects directly to the input pins of the ICM. Consequently, noise present on signal and power rail is conducted directly into ICM and onto the circuit-side winding of the isolation transformer. This noise will pass through the parasitic inter-winding capacitance of the isolation transformer, and/or through other parasitic paths, to the line-side where it will be conducted onto a data cable plugged into the port and/or radiate out of the RJ45 port, causing system EMI problems.

FIG. 3 is a simplified schematic of the Ethernet transceiver IC output driver 40 and the transmit channel 16 of the conventional LAN magnetic interface circuit of FIG. 1. There are several inherent disadvantages associated with this basic configuration that commonly leads to system EMI problems. Some of the major disadvantages include:

1) The center-tap of the primary winding connects directly to the voltage source V+. Pulsed currents, which are drawn from V+ by operation of the switches A and B to drive the transformers, generate noise on the V+ power rail. This is substantial in multi-port systems, wherein many channels are switching on and off at the same time, placing high transient current loads on the V+ power rail. These transient currents can generate voltage spikes, high frequency ringing, droop, and overshoot, which will corrupt the V+ power rail. Additionally, ripple voltage, switching spikes and associated HF (high frequence) ringing from the switching power supply will also be present on V+. Depending on the design of the PCB layout and the source impedance of voltage source V+, this noise the can be extensive, and will be injected directly into the center-taps of the transformers. This noise will then couple to the line-side of the transformer through the transformer's inter-winding capacitance, and through other parasitic paths, where it will be conducted onto a data cable plugged into the port and/or radiate out of the RJ45 port, causing system EMI problems.

2) The transceiver IC's I/O connects directly to the primary winding of the isolation transformer with interconnecting traces on the PCB. Again, noise present on these signal lines will couple through inter-winding capacitance and other parasitic paths to the line-side of the transformer where it will be conducted onto a data cable plugged into the port and/or radiate out of the RJ45 port, causing system EMI problems.

3) 100 Mbps and Gigabit Ethernet transceiver ICs utilize a 125 MHZ clock and incorporate multiple phased locked loops (PLL) running at 125 MHZ. Consequently, and in addition to digital noise from other sources, there will be a strong 125 MHZ presence within the circuit and on the signal and power planes, especially in multi-port systems which have several Ethernet transceiver ICs driving up to 48 ports. This 125 MHZ component, and often to a much greater extent, its harmonics (250, 375, 500, 625, 750, 875 and 1000 MHZ), will pass to the secondary-side of the transformer and are among the worst offending frequencies that cause EMI problems in networking systems It is possible to refine the design of the standard magnetic interface circuit topologies to improve EMI performance. However, the extent of refinement needed to reduce EMI to acceptable levels will significantly increase labor and material costs and can often cause degradation of other electrical performance parameters, which can compromise signal integrity. Additionally, such "improved" designs will not always provide improved EMI performance in different applications or systems platforms.

SUMMARY OF THE INVENTION

It is an object of the present invention to provide a new magnetic circuit topology configuration, which provides greatly improved EMI performance compared to the standard topologies without compromising signal integrity or adding cost.

Other features and advantages of the present invention will become apparent from the following description of the invention which refers to the accompanying drawings.

BRIEF DESCRIPTION OF THE DRAWING(S)

DETAILED DESCRIPTION OF THE INVENTION

Figure 1:
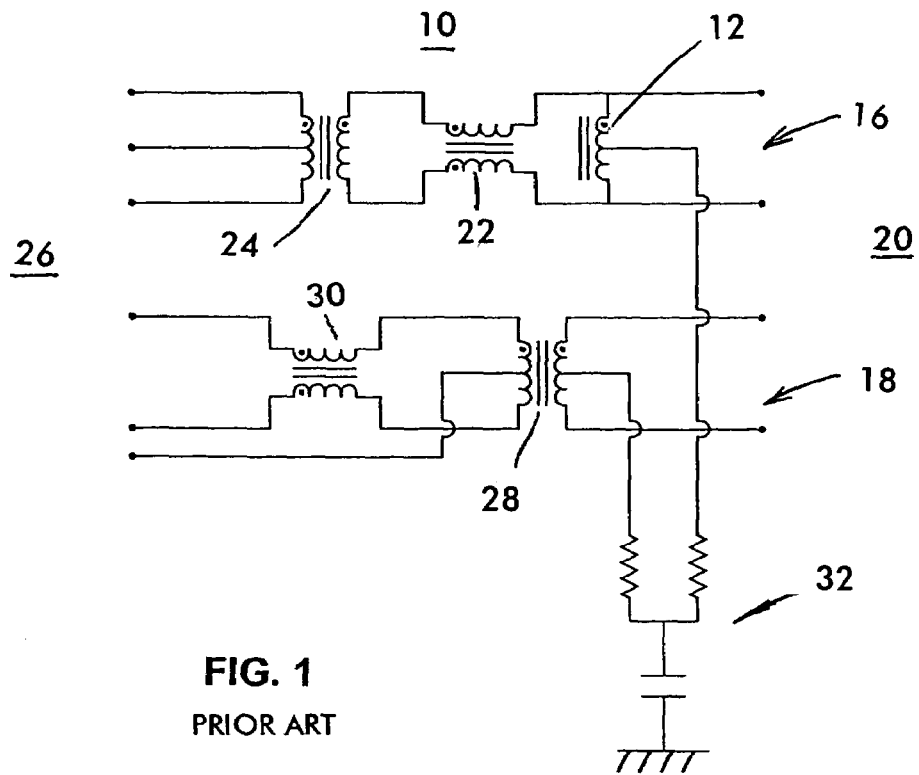
FIG. 1 shows schematically a conventional magnetic interface circuit for Ethernet applications utilizing an autotransformer.
Figure 2:
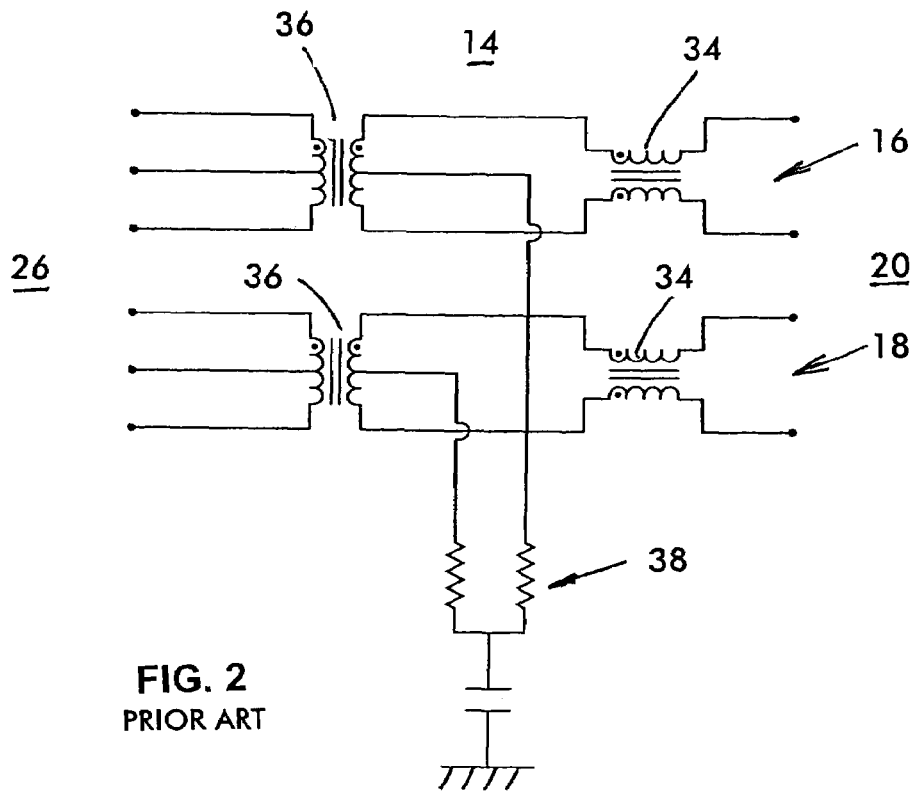
FIG. 2 shows a conventional magnetic interface circuit commonly used for Auto-MDI/MDIX(Media Dependent Interface/Media Dependent Interface Crossover) Ethernet applications.
Figure 3:
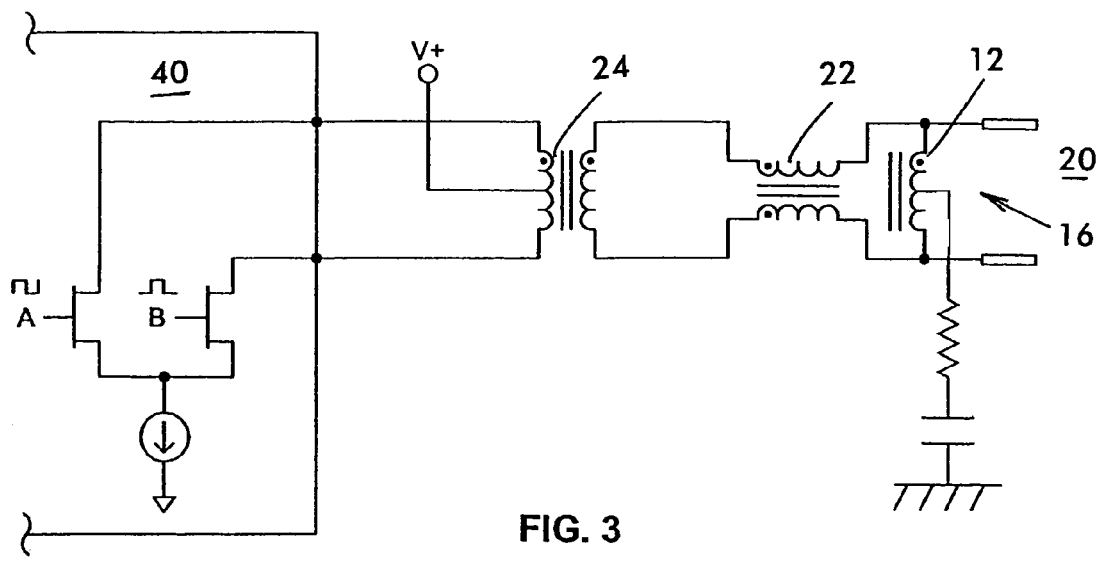
FIG. 3 shows schematically one of the channels of the conventional magnetic interface circuit of FIG. 1 coupled to the out put driver of a transceiver.

The invention will be described in connection with its applicability to EMI suppression in magnetic interface Ethernet applications; however, the invention is not so limited and is equally applicable to other networking applications. Components having the same or similar function are designated with the same reference numerals.

Figure 4:
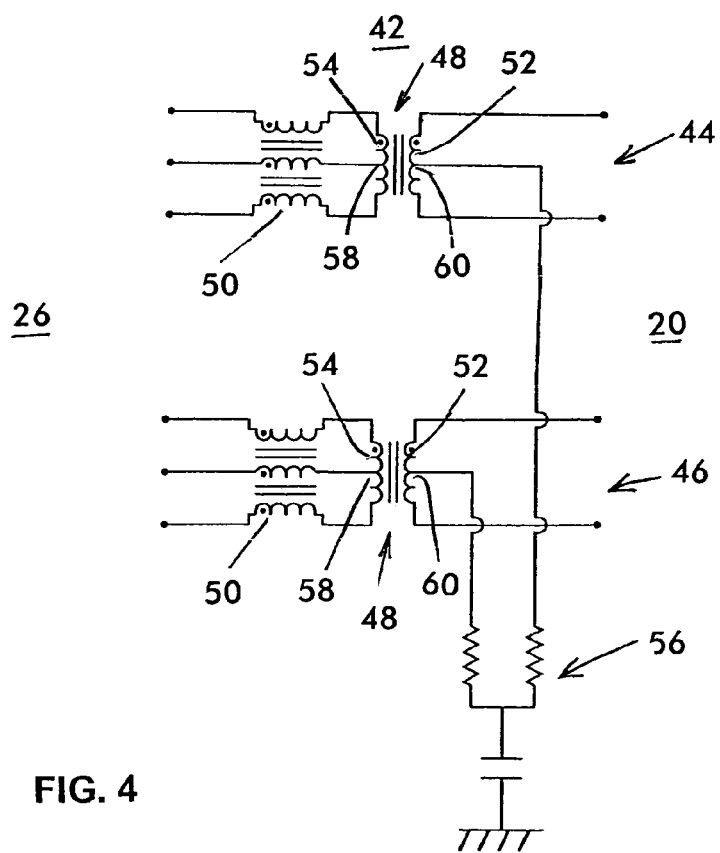
FIG. 4 shows schematically a magnetic interface circuit having a 3-Wire CMC topology in accordance with certain principles of the present invention.

FIG. 4 shows a LAN magnetic interface circuit topology 42 in accordance with certain features of the present invention. The circuit 42 includes two channels: a transmit channel 44 and a receive channel 46. Each channel is identical and includes an isolation transformer 48 and a 3-wire CMC 50 with one of the windings of the isolation transformer 48 connected to the line side 20 of the port and the 3-wire CMC 50 connected between the other winding of the isolation transformer 48 and the circuit side 26 of the channel. A termination network 56 is connected to each of the channels.

The circuit 42 is hereinafter referred to as the "3-Wire CMC embodiment" because of the 3 winding elements on the CMC's 50. The circuit topology of FIG. 4 is unlike all commonly used magnetic interface circuit topologies in a number of ways:

1) The CMC's 50 are placed on the circuit-side 26 of the magnetic interface circuit 42 between the circuit side 26 and the winding 54 of the isolation transformer 48.

2) The center tap 58 of the winding 54 is also wound on the CMC 50, hence the term "3-Wire CMC."

3) The other winding 52 of the transformer 48 connects directly to the line side 20 RJ45 terminals. In the case of the transmit channel 44, this eliminates the need for the autotransformer 12 of FIG. 1 and allows direct connection of the common-mode termination network 56 to the center tap 60 of the winding 52, which will improve its effectiveness. Using a 3-wire CMC enables the magnetic interface circuit to take advantage of the output driver topology of the latest generations of Ethernet transceiver ICs and the way in which they drive the transformer 48. The IC's output stage uses a current-mode drive technique. Simply speaking, the IC drives a fixed level of current through the winding 54 of the transformer 48 to generate a transmit voltage waveform on the winding 52. The nature of the IC's output driver function, in conjunction with the 3-wire CMC magnetic interface circuit enables the desired effects to be achieved.

Figure 5:
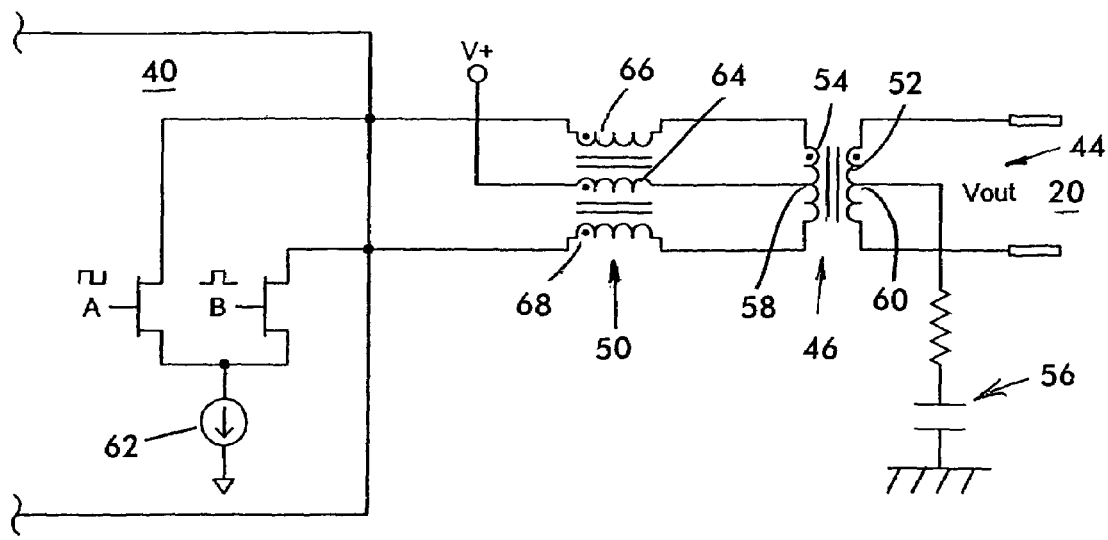
FIG. 5 shows schematically a magnetic interface circuit having a 3-Wire CMC coupled to the out put driver of a transceiver in accordance with certain principles of the present invention.

Turning now to FIG. 5 there is shown a simplified schematic depicting the output circuit stage of an Ethernet transceiver IC connected to the 3-Wire CMC magnetic interface circuit of FIG. 4. The basic function of the configuration shown in FIG. 5 is as follows.

Switches A and B turn on and off in a controlled manner allowing a fixed amount of current, drawn from voltage source V+ to flow through each half of the transformers winding 54 which, in turn, generates a voltage waveform ($V_{out}$). on the winding 52. There are 3 different drive states that the output stage will be in during any given instant of the output waveform, as shown in the table below.

| Drive State | Switch A | Switch B |
|---|---|---|
| 1 | ON | OFF |
| 2 | OFF | ON |
| 3 | ON | ON |

During drive state 1, switch A is on, switch B is off and fixed current i (represented by the constant current source 62) flows from V+ through the middle winding element 64 of the 3-wire CMC 50, into the center tap 58 of the transformer, through the top half of the transformer winding 54, through the outer leg 66 of the CMC 50, and into the IC. This generates a negative voltage at the "dot" side of the transformer winding 52.

During drive state 2, switch B is on, switch A is off and fixed current i flows from V+ through the middle winding element 64 of the 3-wire CMC 50 into the center tap 58 of the transformer, through the bottom half of the transformer winding 54, through the other outer leg 68 of the CMC 50, and into the IC. This generates a positive voltage at the "dot" side of the transformer winding 52.

During drive state 3, fixed current i flows from V+ through the middle winding element 64 of the 3-wire CMC 50 and into the center tap 58 of the transformer. One half of the current (i/2) flows through the top half of the transformer winding 52 and the other half of the current flows through the bottom half winding. The current flowing in the top half of the winding 52 is equal to the current in the bottom half and the two currents are flowing in opposite directions (out of phase) with respect to the center-tap 58. This results in a net zero flux in the transformer core; hence, $V_{out}$ will be zero volts.

Similarly, the drive current flowing through the middle winding 64 of the CMC 50 into the transformer center-tap 60 is always equal to, and out of phase with, the current flowing in the outer windings 66 and 68 of the CMC 50. Hence, the 3-wire CMC 50 will have a very low impedance (theoretically zero) to the drive signal due to flux cancellation, yet it will present a high impedance to the common-mode noise present on both the signal lines AND the V+ power rail. This is the principal mechanism by which the 3-wire CMC magnetic interface circuit 42 blocks and attenuates common-mode noise that otherwise would pass through the transformer's inter-winding capacitance to the line side where it will radiate out of the RJ45 and/or be conducted onto a data cable plugged into the port and cause EMI problems.

The 3-Wire CMC magnetic interface circuit 42 has a cost advantage over the standard circuit designs in that it only requires 4 cores per port for a 10/100Base-T application and 8 cores per port for Gigabit applications, whereas the standard topologies require 5 & 12 cores per port for 100 Mbps & Gigabit Ethernet, respectively. Additionally, due to its inherent effectiveness in EMI suppression, the 3-wire CMC interface circuit 42 is relatively simple and lower in cost compared to that of the standard magnetic circuit interface design.

Figure 6:
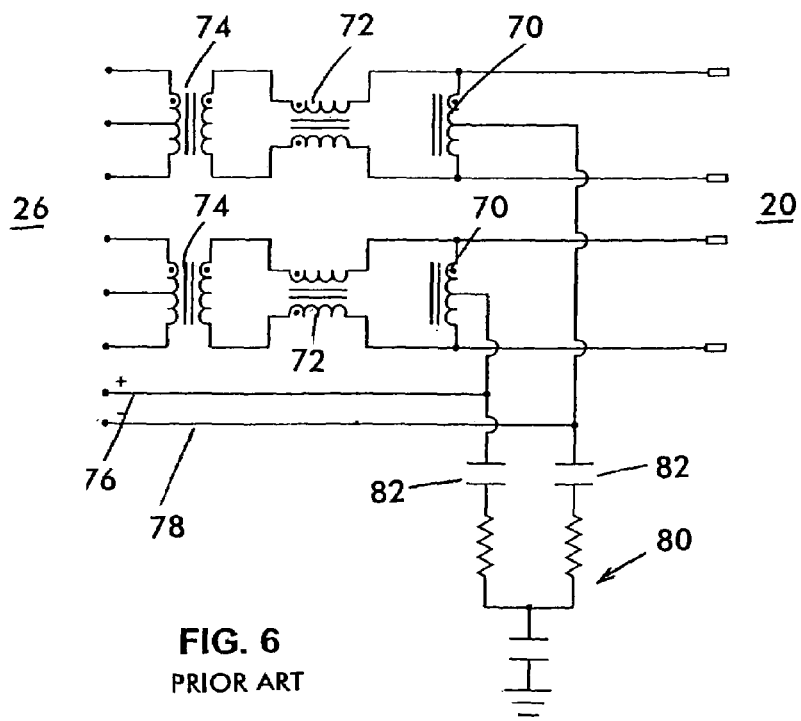
FIG. 6 shows schematically a conventional PoE (power over Ethernet) magnetic interface circuit having a 2-Wire CMC and an additional autotransformer.

The 3-wire CMC circuit topology also provides a critical advantage over the standard 2-wire CMC circuit topologies commonly used in the new Power over Ethernet (PoE) applications. As seen in FIG. 6, these topologies require the addition of an autotransformer 70 to each channel or, as seen in FIG. 7, a shared CMC 84 to the circuit to accommodate the relatively high DC bias in PoE that would otherwise saturate the core of the 2-wire CMC.

In FIG. 6, the autotransformer 70 is connected between a 2-wire CMC 72 and the line side 26 of the port. The CMC 50, in turn, is connected to one of the windings of an isolation transformer 74 whose other winding is connectable to the circuit side 26 of the port. DC busses 76 and 78 are provided for the PoE port and a termination network 80 is connected to each of the autotransformers 70 through DC blocking capacitors 82.

Figure 7:
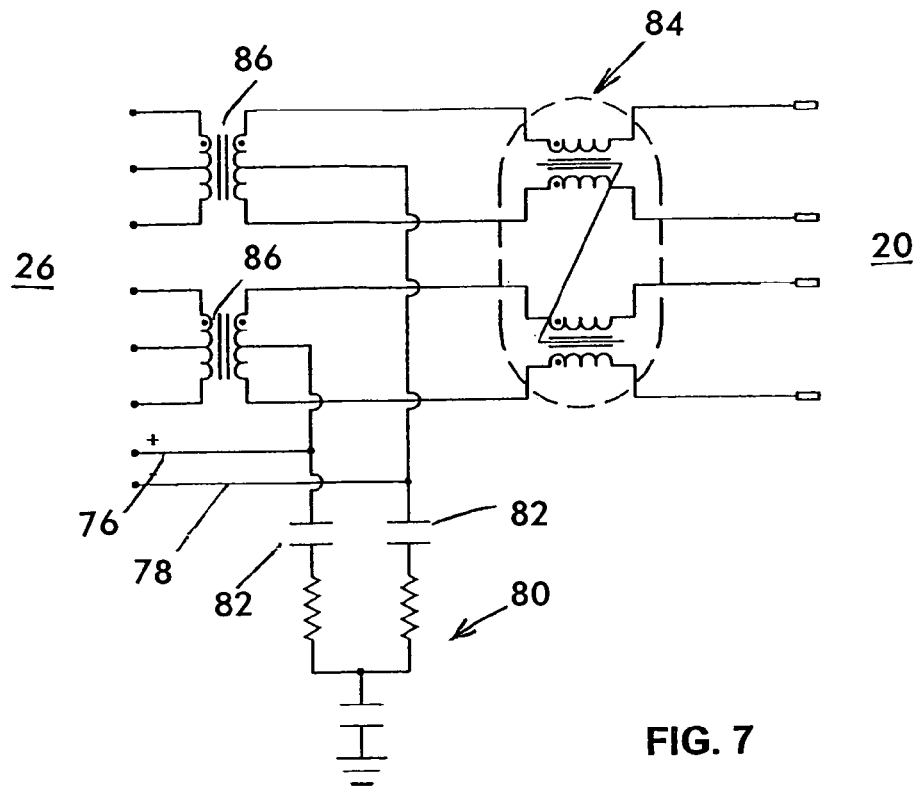
FIG. 7 shows schematically a PoE magnetic interface circuit using a shared CMC.

In FIG. 7, the shared CMC 84 is connected to repective first windings of isolation transformers 86, the second windings of the isolation transformers 86 being connectable to the circuit side 26 of the port. DC busses 76 and 78 are provided for the PoE port and a termination network 80 is connected to each of the isolation transformers 86 through DC blocking capacitors 82.

While these techniques provide solutions for PoE, they add significant cost and can reduce manufacturing yield. Moreover, they decrease filter performance, and degrade the performance of high speed applications like Gigabit Ethernet. This is the case because the added DC bias in PoE reduces the RF impedance of the CMC 72 (FIG. 6), rendering it ineffective. In the case of the shared CMC 84 (FIG. 7) between the two supplying pairs, the crosstalk between the pairs will increase, and there will be greater interwinding capacitance which can lead to signal integrity issues, EMI, susceptibility, and other problems. This will be particularly problematic in Gigabit applications.

Figure 8:
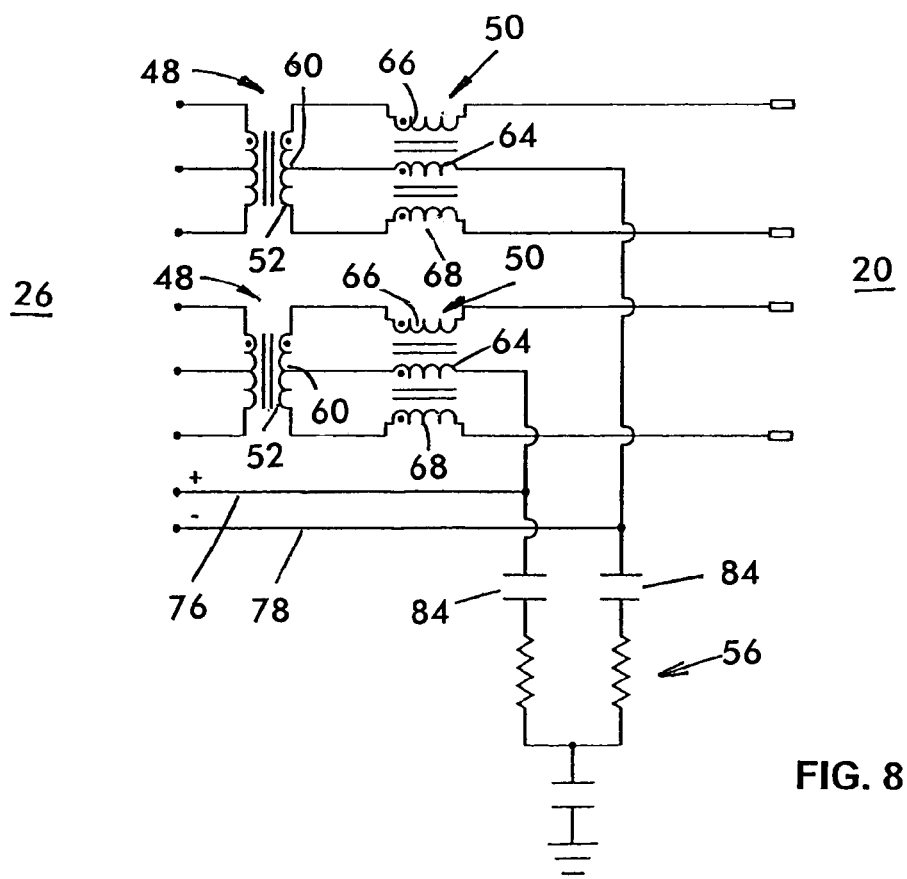
FIG. 8 shows schematically a PoE magnetic interface circuit utilizing a 3-Wire CMC in accordance with certain principles of the present invention.

The 3-wire CMC 50 can be used to overcome all of the aforementioned problems associated with a 2-wire CMC in PoE applications. FIG. 8 shows a PoE circuit topology utilizing the 3-wire CM.

Here, the outer two windings 66 and 68 of the 3-wire CMC 50 are connected to the upper and lower halves of the winding 52 of the isolation transformer 48 and the middle winding 64 is connected between the power busses 76 and 78 and the center tap 60 of the isolation transformer 48. With this configuration, the DC current of the center tap 60 is flowing in the opposite direction to that of the upper and lower halves of the winding 52 and the resultant flux cancellation effectively avoids the DC bias and prevents the saturation of the CMC core without adding crosstalk. The termination network 56 is connected to the respective middle windings 64 of the CMC 50 through blocking capacitors 84.

The 3-wire CMC LAN magnetic interface circuit topology of the present invention provides greatly improved EMI performance compared with standard topologies. This is achieved by its unique circuit configuration which works in conjunction with the Ethernet Transceiver IC's output driver function to provide common-mode filtering of both the signal lines, and the power source, prior to the their connection to the isolation transformer. This configuration effectively blocks and attenuates common-mode noise that would otherwise be present on the transformer's primary winding and couple to the secondary side, causing high levels of EMI. The 3-Wire CMC magnetic interface circuit's enhanced EMI filtering is an inherent characteristic, independent of the system platform or configuration.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A magnetic interface circuit which comprises:
    a transformer having a first winding connected to a first circuit and a second winding connected to a second circuit each of the first and second windings having two output ports and at least one of the windings having a center tap port; and
    a 3-wire common mode choke having a center winding and two outer windings, the center winding being connected to the center tap of the at least one winding and the outer windings being respectively connected to the output ports of the, at least one winding.

2. A magnetic interface circuit for interfacing between the line side and the circuit side of a communication channel, which magnetic interface circuit comprises:
    a transformer having a first winding connected to the line side of the channel and a second winding connected to the circuit side of the channel, each of the first and second windings having two output ports and at least one of the windings having a center tap port; and
    a 3-wire common mode choke having a center winding and two outer windings, the center winding being connected to the center tap of the at least one winding and the outer windings being respectively connected to the output ports of the at least one winding.

3. A magnetic interface circuit according to claim 2, wherein the 3-wire common mode choke is connected to the center tap port of the first winding of the transformer.

4. A magnetic interface circuit according to claim 2, wherein the 3-wire common mode choke is connected to the center tap port of the second winding of the transformer.

5. A magnetic interface circuit for an Ethernet port having a line side and a circuit side, which magnetic interface circuit comprises:
    a transformer having a first winding connected to the line side of the port and a second winding connected to the circuit side of the port, each of the first and second windings having two output connections and at least one of the windings having a center tap connection; and
    a 3-wire common mode choke having a center winding and two outer windings, the center winding being connected to the center tap of the one winding and the outer windings being respectively connected to the output connections of the at least one winding.

6. A magnetic interface circuit according to claim 5, wherein the 3-wire common mode choke is connected to the center tap connection of the first winding of the transformer.

7. A magnetic interface circuit according to claim 5, wherein the 3-wire common mode choke is connected to the center tap connection of the second winding of the transformer.

8. A magnetic interface circuit for an Ethernet port having at least first and second two channels, each channel having line side terminals and circuit side terminals, which magnetic interface circuit comprises:
    a first transformer having a first winding connected to the line side of the first channel and a second winding, each of the first and second windings of the first transformer having two output connections and the first winding having a center tap connection;
    a first 3-wire common mode choke having a center winding and two outer windings, the center winding of the first 3-wire common mode choke being connected to the center tap of the second winding of the first transformer and the outer windings being respectively connected to the output connections of the second winding and to respective terminals of the circuit side of the first channel;
    a second transformer having a first winding connected to the line side of the second channel and a second winding, each of the first and second windings having two output connections and at least one of the windings having a center tap connection; and
    a second 3-wire common mode choke having a center winding and two outer windings, the center winding of the second 3-wire common mode choke being connected to the center tap of the second winding and the outer windings being respectively connected to the output connections of the second winding and to respective terminals of the circuit side of the second channel.

9. A magnetic interface circuit according to claim 8, wherein each of the second windings of the first and second transformers has a center tap connection and a termination network is connected to the respective center tap connections of the second windings of the first and second transformers.

10. A magnetic interface circuit for an Ethernet port having at least first and second channels, each channel having line side terminals and circuit side terminals, which magnetic interface circuit comprises:
    a first transformer having a first winding connected to the circuit side of the first channel and a second winding, each of the first and second windings of the first transformer having two output connections and the second windings having a center tap connection;
    a first 3-wire common mode choke having a center winding and two outer windings, the center winding of the first 3-wire common mode choke being connected to the center tap of the second winding of the first transformer and the outer windings being respectively connected to the output connections of the second winding and
    a second transformer having a first winding connected to the circuit side of the second channel and a second winding, each of the first and second windings having two output connections and the second winding having a center tap connection; and a second 3-wire common mode choke having a center winding and two outer windings, the center winding of the second 3-wire common mode choke being connected to the center tap of the second winding and the outer windings being respectively connected to the output connections of the second winding.

11. A magnetic interface circuit according to claim 10, wherein a termination network is connected to the respective center windings of the first and second 3-wire common mode chokes.

12. A magnetic interface circuit according to claim 10, wherein the respective center windings of the first and second 3-wire common mode chokes are connectable to a DC voltage source.

13. A magnetic interface circuit as in any of claims 1–7, wherein the transformer is an isolation transformer.

14. A magnetic interface circuit as in any of claims 8–11, wherein the first and second transformers are isolation transformers.

* * * * *